United States Patent
Oprins et al.

(10) Patent No.: US 10,334,755 B2
(45) Date of Patent: Jun. 25, 2019

(54) LIQUID COOLING OF ELECTRONIC DEVICES

(71) Applicant: IMEC VZW, Leuven (BE)

(72) Inventors: Herman Oprins, Herent (BE);
Vladimir Cherman, Heverlee (BE);
Eric Beyne, Heverlee (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/388,914

(22) Filed: Dec. 22, 2016

(65) Prior Publication Data

US 2017/0196120 A1 Jul. 6, 2017

(30) Foreign Application Priority Data

Dec. 30, 2015 (EP) .................................... 15203217

(51) Int. Cl.
*H05K 7/20* (2006.01)
*H05K 5/06* (2006.01)
*H01L 23/473* (2006.01)

(52) U.S. Cl.
CPC ..... *H05K 7/20272* (2013.01); *H01L 23/4735* (2013.01); *H05K 5/06* (2013.01)

(58) Field of Classification Search
None
See application file for complete search history.

(56) References Cited

U.S. PATENT DOCUMENTS

| | | | | | |
|---|---|---|---|---|---|
| 5,270,572 | A | * | 12/1993 | Nakajima | H01L 23/4735 165/104.33 |
| 5,309,319 | A | * | 5/1994 | Messina | H01L 23/4336 165/142 |
| 5,436,501 | A | * | 7/1995 | Ikeda | H01L 23/4735 165/80.4 |
| 5,959,351 | A | * | 9/1999 | Sasaki | F15D 1/08 257/714 |
| 7,511,957 | B2 | * | 3/2009 | Campbell | F28C 3/08 165/80.4 |
| 9,165,857 | B2 | * | 10/2015 | Song | H01L 23/473 |
| 2005/0211418 | A1 | * | 9/2005 | Kenny | F04B 17/00 165/80.4 |
| 2015/0197062 | A1 | * | 7/2015 | Shinar | B29C 67/0088 700/98 |

* cited by examiner

*Primary Examiner* — Courtney L Smith
(74) *Attorney, Agent, or Firm* — Knobbe Martens Olson & Bear, LLP

(57) ABSTRACT

A liquid cooling system for cooling an electronic device comprising a chip or a chip package comprising a chip is described. The liquid cooling system comprises an inlet plenum comprising a coolant feeding channel oriented substantially parallel with the plane of a main surface to be cooled of the chip and a plurality of inlet cooling channels fluidically connected to the coolant feeding channel and arranged vertically for impinging a liquid coolant directly on said main surface of the chip. The vertically oriented inlet cooling channels are substantially parallel to vertically oriented outlet cooling channels and are separated by a thermally isolating material. The liquid cooling system further comprises at least one cavity wherein a plurality of inlet and outlet cooling channels end. The cavity is arranged for allowing interaction between the liquid coolant and the main surface of the chip and thus comprises a heat transfer region.

12 Claims, 6 Drawing Sheets

LIQUID COOLING OF ELECTRONIC DEVICES

CROSS-REFERENCE TO RELATED APPLICATION

Any and all priority claims identified in the Application Data Sheet, or any correction thereto, are hereby incorporated by reference under 37 CFR 1.57. This application claims the benefit of European Patent Application No. EP 15203217.3, filed on Dec. 30, 2015. The aforementioned application is incorporated by reference herein in its entirety, and is hereby expressly made a part of this specification.

FIELD OF THE INVENTION

The embodiments relate to the field of electronic devices, more particularly, to systems and methods using a forced liquid cooling system for cooling of electronic devices.

BACKGROUND OF THE INVENTION

Trends in micro electronics show an increase in power dissipation as well in power density. As a result the limits of air cooling for high performance applications are reached and those of low end applications will be reached in the coming years. In order to deal with this limit, a transition to liquid based cooling techniques is gradually made.

Different types of cooling are known. Cooling can be active or passive. In passive cooling, no additional power is used and the heat is transported by conduction and/or radiation heat transfer. Two examples of passive cooling are natural convection cooling (passive air cooling) and passive liquid cooling using heat pipes and vapor chambers. In active cooling, the fluid motion is assisted by an external source, such as a fan for a forced air cooled system or a pump in a liquid cooled system.

Conventional forced liquid cooling systems consist of a separate cooling unit mounted to the chip. This cooling unit contains channels parallel to the chip surface through which a coolant is pumped. As the liquid moves through the channels, it takes up the heat from the chip and the liquid heats up.

For this conventional liquid cooling approach, some drawbacks are known.

Since the liquid temperature increases along the length of the channel, the part of the chip at the end of the channel is cooled less efficiently than the part at the beginning of the channel resulting in a temperature gradient across the chip surface. This temperature increase is referred to as the caloric thermal resistance.

The presence of the adhesive, or thermal interface material (TIM), between the chip and the cooler results in an additional thermal resistance. In the case of a high performance liquid cooler, the contribution of this TIM thermal resistance can be significant or even dominating.

In such conventional liquid cooling approach, the required pressure also scales linearly with the length of cooling channels.

Some solutions were presented that try to deal with at least some of these problems. US patent application US2009/0084931, by Intel Corporation, discloses a liquid cooling device for cooling a die. The liquid cooling device comprises a support block supporting a plurality of vertical channels transporting fluid to and from a bare die surface for removing heat. The vertical channels are formed by parallel pipes, positioned adjacent and separated by walls.

In "Microjet Cooler with Distributed Returns", Heat Transfer Engineering (2007) 28(8-9) p 779-787, Natarajan and Bezama describe a cooler made in ceramic material providing a liquid microjet array based on a manifold showing a plurality of inlet jets and outlet jets.

US patent application US2005/0143000, by Danfoss Silicon Power GmbH, a cooling device is described that comprises a heat conducting cooling plate on the side of the electronic power components to be cooled in combination with a platelike cooling fluid distributing device. The cooling device comprises a first plate in which outlets and a plurality of drain outlets are evenly distributed and further plates defining a feed channel and a drain channel connected to respectively the outlets and the drain outlets.

SUMMARY OF THE INVENTION

It is an object of the embodiments to provide device having an efficient liquid cooling system.

It is an advantage of the embodiments that devices comprising a cooling system that applies liquid jet impingement directly on an exposed die 2D or 3D chip package are provided.

It is furthermore an advantage of the embodiments that cost efficient fabrication technologies can be uses, such as for example injection molding or 3D printing.

It is an advantage of the active liquid cooling devices according to the embodiments, that liquid cooling has a high thermal capacitance, has a lower power consumption and has a high cooling performance e.g. compared to air cooling with the same pumping power.

It is an advantage of the active liquid cooling devices according to the embodiments, e.g. compared to air cooling, that the dimensions of the cooling channels can be low, i.e. in the order of a few hundred micrometers.

It is an advantage of the embodiments that they can be configured for latent heat transfer, i.e. make use of 2 phase cooling.

The above objective is accomplished by a method and device according to the embodiments.

The embodiments relate to a liquid cooling system for cooling an electronic device comprising a chip or a chip package comprising a chip, the liquid cooling system comprising:

an inlet plenum comprising a coolant feeding channel oriented substantially parallel with the plane of a main surface to be cooled of the chip and a plurality of inlet cooling channels fluidically connected to the coolant feeding channel and arranged vertically for impinging a liquid coolant directly on said main surface of the chip, when the liquid cooling system is mounted to the chip or a chip package and is in operation, an outlet plenum comprising a coolant removal channel and a plurality of outlet cooling channels arranged vertically for guiding the liquid coolant, after impinging of the coolant on the main surface to be cooled of the chip, towards the coolant removing channel for removal of the liquid coolant from the liquid cooling system, when the liquid cooling system is mounted to the chip or the chip package and is in operation, the vertically oriented inlet cooling channels being substantially parallel to the vertically oriented outlet cooling channels and being separated by a thermally isolating material, the liquid cooling system further comprises at least one cavity wherein a plurality of inlet and outlet cooling channels end, the at least one cavity also being arranged for allowing interaction between the liquid coolant provided through the inlet cooling channels and the main surface of the chip, when the liquid cooling system is mounted to the chip or the chip package and is in operation, the cavity thus comprising a heat transfer region.

It is an advantage of the embodiments that the length of the inlet cooling channels is substantially smaller than the length of the coolant feeding channel, resulting in a limitation of the pressure drop occurring in the cooling system.

It is an advantage of the embodiments that the cooling system can be manufactured using conventional manufacturing techniques, without the need for semiconductor processing techniques.

According to some embodiments, also the feeding and removal channel may be separated by thermally isolation material. According to still other embodiments the cavity may be formed by thermally isolation material.

It is an advantage of the embodiments that a further improved cooling and/or a cheaper construction can be obtained.

The liquid cooling system also may comprise a sealing means for hermetically sealing the liquid cooling system directly to the main surface of the chip or on the chip package, when the liquid cooling system is mounted to the chip or chip package. The coolant so can be prevented from reaching other parts of the chip that may not come into contact with the coolant. The sealing means may be a permanent sealing means.

The coolant removal channel may be parallel to the coolant feeding channel. It thus may be substantially parallel with the main surface of the chip to be cooled. The coolant thus is removed via the outlet of the outlet plenum.

It is an advantage of the embodiments that a plurality of outlet cooling channels is used by each inlet cooling channel, thus resulting in a spontaneous flow of the coolant from inlets to outlets.

It is an advantage of the embodiments that substantially no walls are present in the heat transfer region, allowing a locally more accurate cooling, i.e. also at the position where otherwise walls of compartments would be present.

The distribution of inlet cooling channels may be spatially uniform. The distribution of inlet cooling channels alternatively may be not spatially uniform. It is an advantage of the embodiments that the liquid cooling system can be adapted to the particular spatial thermal profile of the chip. In other words, the cooling can be tuned towards the thermal profile of the chip. The latter advantageously can be obtained when using techniques such as 3D printing or micromachining, wherein variations in design, e.g. for the inlet cooling channels spatial position, can be easily implemented.

The cross-section of an inlet cooling channel may be substantially smaller than the average cross-section of the outlet cooling channels. It is an advantage of the embodiments that the pressure drop occurring between inlet and outlet is adjusted such that an appropriate flow direction of the coolant is obtained.

The liquid cooling system may comprise a plurality of unit cells, each unit cell comprising an inlet cooling channel and a plurality of outlet cooling channels, and the unit cells arranged such that outlet cooling channels are used in common by the different unit cells. It is an advantage of the embodiments that the cooling system is easily scalable and thus that accurate cooling can also be obtained for chips having larger surface areas.

The inlet cooling channels may comprise or consist of orifices, the different inlet cooling channels thus forming a showerhead for impinging a plurality of liquid coolant jets onto the main surface to be cooled of the chip.

The vertically oriented inlet cooling channels may be positioned adjacent the vertically oriented outlet cooling channels and such that each of the vertically oriented inlet cooling channel is positioned closer to a plurality of vertically oriented outlet cooling channels than to another vertically oriented inlet cooling channel.

The thermally insulating material may be any of plastics, low-temperature, co-fired ceramics, glass-reinforced epoxy laminate sheets. In some embodiments, e.g. in case of injection molding, formulated materials may be used, such as combination of polymers and filler particles, epoxy mold compound (EMC), glob top, etc. In case of 3D printing, for example thermoplastic materials or photopolymers, may be used. Alternatively a PCB can be used whereby the horizontal layers for the plenums are formed in the PCB, with holes drilled in it to create the vertical channels and with spacer material to create the gap height. The PCB could also be used to 3D print on in case printing on Si is not possible or in case the holes are too small for 3D printing. The embodiments also relates to an electronic device comprising a chip or a chip package comprising a chip, the electronic device furthermore comprising a liquid cooling system as described above. In the electronic device, the liquid cooling system is mounted to the chip or chip package, the plurality of inlet cooling channels are arranged vertically for impinging a liquid coolant directly on said main surface of the chip, when the liquid cooling system is in operation, the plurality of outlet cooling channels are arranged vertically for guiding the liquid coolant, after impinging of the coolant on the main surface to be cooled of the chip, towards the coolant removing channel for removal of the liquid coolant from the liquid cooling system, when the liquid cooling system is in operation, and the at least one cavity is arranged for allowing interaction between the liquid coolant provided through the inlet cooling channels and the main surface of the chip, when the liquid cooling system is in operation, the cavity thus comprising a heat transfer region.

The electronic device may comprise a sealing means for hermetically sealing the liquid cooling system to the chip or chip package.

The liquid cooling system may be made separately and fixed to chip or chip package using a fixing means. The electronic device may comprise glue between the liquid cooling system and the chip or chip package for fixing the liquid cooling system thereto.

The liquid cooling system may be directly formed on the chip package. The material of which the liquid cooling system is formed thus may form the mixing means. It is an advantage of the embodiments that 3D printing or micromachining may be used for directly forming the cooling system on the chip or chip package. The fixing means and/or sealing means may be formed when forming the liquid cooling system directly on the chip package.

In some embodiments, the fixing means may correspond with the hermetic sealing means. It is an advantage of the embodiments that no separate hermetic sealing means needs to be provided but that this may correspond with the fixing means used for fixing the liquid cooling system to the chip or chip package.

It is an advantage of the embodiments that conventional manufacturing techniques may be used for manufacturing of the liquid cooling system, such as for example molding, micromachining, drilling, CNC milling, 3D printing, welding of thermoplastic materials, gluing, etc.

The system furthermore may comprise a pumping means for pumping the coolant to the coolant feeding channel.

The embodiments also relates to a method for cooling an electronic device as described above, the method comprising pumping a liquid coolant through the inlet of the inlet plenum towards a main surface to be cooled of the chip such that the coolant is impinging via said inlet cooling channels directly on the chip main surface, and collecting the coolant, after impingement on the chip main surface for removing from the liquid cooling system through an outlet of the outlet plenum, via a plurality of outlet cooling channels substantially vertical to the chip, each outlet cooling channels arranged for collecting coolant delivered by a plurality of inlet cooling channels.

The embodiments also relates to a method of manufacturing an electronic device comprising a liquid cooling system, the method comprising obtaining an electronic device comprising a chip or a chip package comprising a chip, providing a liquid cooling system as described above and fixing it to the chip or chip package thereof, said providing a liquid cooling system being such that direct impinging of coolant on the chip surface occurs during operation.

Providing a liquid cooling system may comprise gluing the liquid cooling means to the chip or chip package. Said gluing may include forming a hermetical seal between the liquid cooling system and the chip or chip package to avoid coolant to flow to regions on the chip or chip package where no coolant should be present. Alternatively, the method may comprise a separate step of providing a hermetical seal.

Providing a liquid cooling system also may comprise directly forming the liquid cooling system on the chip or chip package of the electronic device. The latter may for example be obtained by 3D printing. Directly forming the liquid cooling system on the chip or chip package may result in the fixing of the liquid cooling system on the chip or the chip package. In some embodiments, directly forming the liquid cooling system on the chip or chip package also may result in forming a hermetic seal between the liquid cooling system and the chip or chip package.

Particular and preferred aspects of the invention are set out in the accompanying independent and dependent claims. Features from the dependent claims may be combined with features of the independent claims and with features of other dependent claims as appropriate and not merely as explicitly set out in the claims. These and other aspects of the invention will be apparent from and elucidated with reference to the embodiment(s) described hereinafter.

Figure 1:
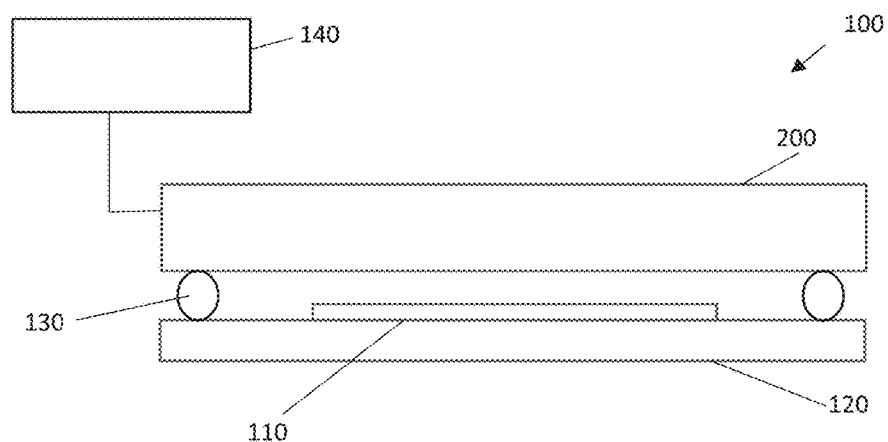
FIG. 1 illustrates a schematic representation of a device comprising a cooling system, according to an embodiment of the embodiments.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The embodiments will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner.

It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the embodiments, the only relevant components of the device are A and B.

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Where a range of values is provided, it is understood that the upper and lower limit, and each intervening value between the upper and lower limit of the range is encompassed within the embodiments.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting.

All references cited herein are incorporated herein by reference in their entirety. To the extent publications and patents or patent applications incorporated by reference contradict the disclosure contained in the specification, the specification is intended to supersede and/or take precedence over any such contradictory material.

Reference throughout this specification to "one embodiment" or "an embodiment" means that a particular feature, structure or characteristic described in connection with the embodiment is included in at least one embodiment of the embodiments. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In a first aspect, the embodiments relates to an electronic device comprising a chip, a chip package and a liquid cooling system. The chip may be any type of chip, e.g. integrated circuit chip, that requires cooling. According to the embodiments, the liquid cooling system comprises an inlet plenum comprising a coolant feeding channel oriented substantially parallel with the plane of a main surface of a chip to be cooled. The inlet plenum also comprises a plurality of inlet cooling channels fluidically connected to the coolant feeding channel and arranged vertically for impinging a coolant directly on the main surface of the chip, typically in a direction vertical to the surface of the chip. Fluidically connection thereby means that the coolant feeding channel and the inlet cooling channels are connected such that coolant fluid can flow from the coolant feeding channel to the inlet cooling channels. According to embodiments, the cooling system also comprises an outlet plenum comprising a coolant removal channel and a plurality of outlet cooling channels arranged vertically for guiding a coolant, after impinging on the main surface of the chip to be cooled, towards the coolant removing channel for removal of the coolant from the liquid cooling system. The inlet cooling channels and outlet cooling channels are oriented parallel to each other. At least the inlet cooling channels and the outlet cooling channels are separated by thermally isolating material. In some embodiments, also the coolant feeding channel and the coolant removal channel are separated from each other by thermally isolating material. In yet other embodiments, also the cavity may be formed by a material being a thermally isolating material. According to some the embodiments, the inlet cooling channels and outlet cooling channels may furthermore be positioned adjacent each other and arranged such that each of the vertically oriented inlet cooling channel is positioned closer to a plurality of vertically oriented outlet cooling channels than to another vertically oriented inlet cooling channel.

The cooling system also comprises at least one cavity wherein a plurality of the inlet and outlet cooling channels end. In such a cavity one inlet cooling channel and a plurality of outlet cooling channels may end, or a plurality of inlet cooling channels and plurality of outlet cooling channels may end. The at least one cavity is, according to the embodiments, arranged for allowing interaction between the coolant and the main surface of the chip, when the liquid cooling system is in operation, the cavity thus comprising a heat transfer region. In this heat transfer region, thus the heat exchange between the chip and the coolant occurs.

The cavity advantageously is an open space. In advantageous embodiments, since the outlet cooling channels and the inlet cooling channel(s) end in this open space cavity, the outlet cooling channels can be used by different inlet cooling channels.

According to some the embodiments, the cooling system furthermore may comprise a sealing means for hermetically sealing the cooling system directly on the surface of the chip or chip package. Such a sealing means may automatically be formed when the cooling system is grown directly on the surface of the chip or chip package. Alternatively, it may be provided as additional sealing means. In some embodiments the sealing means also may correspond with the fixing means, i.e. the hermetic sealing may be provided by the fixing means, e.g. glue, positioned between the cooling system on the chip or chip package for fixing these elements together.

FIG. 1 illustrates a schematic representation of a cross-section of an electronic device comprising a liquid cooling device according to the embodiments. It illustrates an electronic device 100 comprising a cooling system 200, a chip to be cooled 110 and a chip package 120 comprising a chip package substrate 122. FIG. 1 furthermore comprises a sealing means 130 for sealing the cooling system 200 to the chip or chip package 120. The system may also comprise a pumping means 140 for pumping the liquid through the cooling system 200

Figure 2:
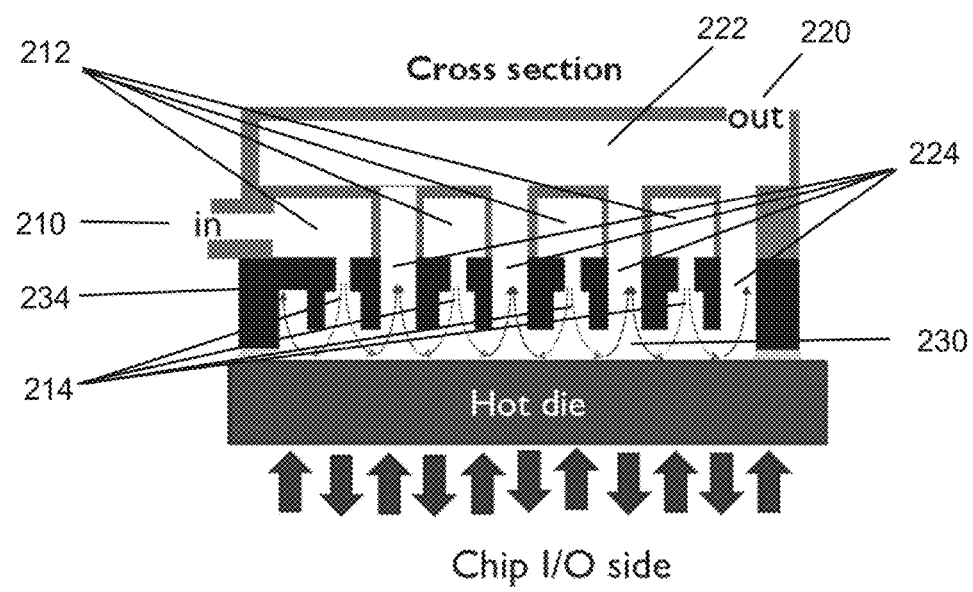
FIG. 2 illustrates a schematic representation of a cross-section of a device comprising a cooling system according to an embodiment of the embodiments.
Figure 3:
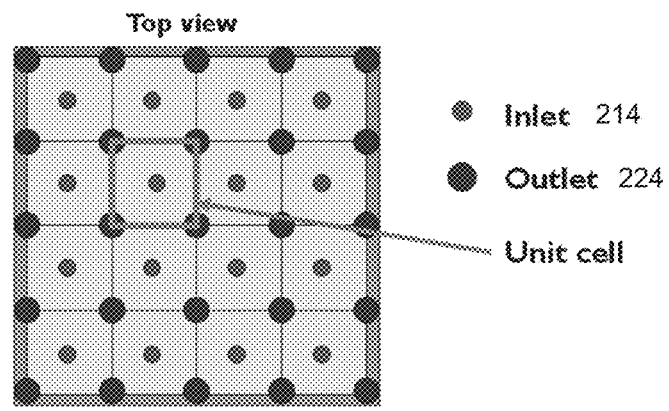
FIG. 3 illustrates a schematic representation of a top view of the inlet cooling channels and the outlet cooling channels of a device comprising a cooling system according to an embodiment of the embodiments.

By way of illustration, a system according to an exemplary embodiment of the embodiments is shown in FIG. 2 in cross-section. In FIG. 3 the inlet and outlet coolant channel arrangement is shown in top view. The system illustrates the cooling system 200 with the inlet plenum 210 wherein a coolant feeding channel 212 and a plurality of inlet coolant channels 214 are provided. It furthermore illustrates the output plenum 220 comprising a coolant removal channel 222 and a plurality of outlet coolant channels 224 (partly running through the inlet plenum). The inlet cooling channels 214 and the outlet cooling channels 224 are separated by thermally isolating material 234. The system comprises a cavity configured as a heat transfer region 230 wherein the plurality of inlet cooling channels 214 and the plurality of outlet cooling channels 224 end. In the heat transfer region 230, coolant injected from the inlet coolant channels 214 is impinging on the chip surface 110 and collected in the outlet coolant channels 224. The sealing means 130 is provided such that the chip backside can be exposed and that the coolant does not make contact with the chip front side or with the electrical circuitry of the package substrate. The sealing means 130 may be provided directly on the chip back side. The sealing means 130 may for example be positioned close to the chip edge to cool the full chip area as much as possible or may for example be present on a smaller part of the chip. The sealing can also be done on the mold compound that surrounds the chip, for example in case of a molded package with exposed chip back side. In another alternative, the sealing can be done on the package substrate, whereby the chip front side and flip chip connections are sufficiently sealed by underfill material and that no package circuitry is exposed to the coolant. According to the embodiments, the sealing means advantageously is a permanent sealing connection. The sealing means in some embodiments may be made of a thermally curable or UV curable adhesive (at room temperature) that will create a permanent hermetic connection between the chip or chip package and the cooler.

According to the embodiments, the coolant is directly ejected on the chip surface using substantially vertical impingement perpendicular on the chip surface. More particularly, the liquid coolant is provided directly on the chip backside. It is an advantage of the embodiments that caloric thermal resistance can be avoided. The latter is caused by the fact that substantially all liquid impinging on the surface has the same inlet temperature, as the vertical channels (i.e. perpendicular to the surface of the chip) are short and split off from an coolant feeding channel positioned separated from and substantially parallel to the chip surface.

Since the cooling channels are perpendicular to the chip surface to be cooled, their length is much shorter compared to channels parallel with the chip surface and scaling of the cooling dimension does not result in a substantial pressure drop increase.

It is an advantage of the embodiments that the cooling device can be co-fabricated with the package, resulting in a less complex way of manufacturing. More specifically, the device is compatible with low cost manufacturing techniques, avoiding expensive silicon processing. The latter results in less complex and less time and energy consuming manufacturing techniques.

It is an advantage of the embodiments that caloric and thermal interface material thermal resistance can be avoided, resulting in a better thermal performance.

It is an advantage of the embodiments that the layout of the inlets and outlets can be easily customized to the specific cooling needs that are present for cooling of the particular chip design. The latter allows optimization of the thermal and fluidic performance.

It is an advantage of the embodiments that cooling in high performance electronic applications can be performed in an efficient way.

It is an advantage of the embodiments that the liquid cooling device is an easily scalable system that can be made up of a plurality of unit cells. A unit cell can have a single inlet and can have multiple outlets. The system is $N^2$ scalable with the chip area. It is an advantage of the embodiments that cold coolant is provided to each chip location, resulting in a lower caloric thermal resistance.

Using a customized array of inlet cooling channels and outlet cooling channels, the cooling performance of the impinging cooling device can be optimized depending on the on-chip cooling requirements. More particularly, the inlet cooling channels and the outlet cooling channels can be positioned at those places where optimum cooling is required.

According to one embodiment, the cooling system implemented in the device may comprise or consist of three horizontal layers: An outlet plenum, an inlet plenum and a heat transfer region. According to the embodiments the device lay-out may be such that the heat transfer region is positioned closest or on the chip or die surface to be cooled, above the heat transfer region, the inlet plenum is positioned, comprising the coolant feeding channel, and above the inlet plenum, the outlet plenum is positioned. According to the embodiments, the liquid coolant may be provided to the coolant feeding channel formed in the inlet plenum by means of an external pressure. The inlet connection toward the coolant feeding channel can be either vertically or laterally connected to the cooling system. The pressure difference between the inlet connection and the outlet connections is the driving force for the coolant transport. The coolant feeding channel distributes to a plurality of inlet cooling channels which may be formed as a matrix of orifices in the inlet plenum which create impinging liquid jets on the die surface, i.e. the many orifices of the inlet act as a shower head to eject the coolant in the heat transfer region that is form by the space between the inlet plenum and the chip surface on which the coolant is impinged. According to the embodiments, each inlet is surrounded by multiple (shared) outlet cooling channels that are connected to the output plenum from where the coolant is removed from the cooling device through the outlet connection. Since the pressure drop over the inlets is larger than the one over the outlets, because there are more outlets and/or because they are selected to have a larger diameter, the flow will spontaneously move in the correct directions.

According to some the embodiments, the location of the inlet cooling channels and outlet cooling channels could be uniformly distributed over the chip area. Alternatively, the location could be optimized depending on the on-chip cooling requirements and power dissipation profiles. The design freedom includes the location of inlet cooling channels in the inlet plenum and the distance between the inlet and outlets. The optimization criteria typically are the chip temperature distribution (max temperature or temperature gradient) and the pressure drop, allowing a customization of the cooler.

The heat transfer region is intended to be an open region without any structures or walls to create separate compartments to confine the coolant flow. Mechanical support structures could however be added to provide the required stiffness to the cooling device. Nevertheless, they do not form a fully separated compartment per inlet cooling channel.

The envisaged size of the inlet channels range from 10 μm to 3 mm. This may also be influenced by the fabrication technique used. The size of the outlet channels advantageously is such that the total area of the outlet channels is larger than the one of the inlet channels. The size and pitch of the inlet channel (area scaling with number of channels and diameters) also typically is related to the cross sectional area of the inlet plenum to keep the total cross-section constant.

The dimensions of pitch and distance between the chip surface and inlet channels may be determined by simulations in order to optimize the fluid flow and to minimize the thermal resistance.

In a second aspect, the embodiments also relates to a cooling system for cooling an electronic device comprising a chip and chip package. The cooling system comprises an inlet plenum comprising a coolant feeding channel oriented substantially parallel with the plane of a main surface of the chip to be cooled and a plurality of inlet cooling channels fluidically connected to the coolant feeding channel and arranged vertically for impinging a coolant directly on the main surface of the chip, when the cooling system is mounted to the chip or chip package comprising the chip and when the cooling system is in operation.

It also comprises an outlet plenum comprising a coolant removal channel and a plurality of outlet cooling channels arranged vertically for guiding a coolant, after impinging on the main surface of the chip to be cooled, towards the coolant removing channel for removal of the coolant from the liquid cooling system, when the liquid cooling system is mounted to the chip or chip package and is in operation. According to the embodiments the vertically oriented inlet cooling channels are substantially parallel to the vertically oriented outlet cooling channels and separated by thermally isolating material.

The liquid cooling system further comprises at least one cavity wherein a plurality of inlet and outlet cooling channels end, the at least one cavity also being arranged for allowing interaction between the liquid coolant provided through the inlet cooling channels and the main surface of the chip, when the liquid cooling system is mounted to the chip or the chip package and is in operation, the cavity thus comprising a heat transfer region. Other features and advantages may be as described in the first aspect.

In one aspect, the embodiments also relates to a fabrication method for manufacturing a device comprising a cooling system. The method comprises obtaining an electronic device comprising a chip and chip package comprising a chip. The method comprises providing a liquid cooling system as described above and fixing it to the chip or chip package thereof. The providing a liquid cooling system is such that direct impinging of coolant on the chip surface occurs during operation.

The cooling system or part thereof is typically made of a material having a low thermal conductivity in order to limit the heat exchange between the inlet plenum and the outlet plenum and to avoid pre-heating of the coolant between the inlet cooling channels and the outlet cooling channels. In one example such low thermal conductivity material is provided between the inlet cooling channels and the outlet cooling channels. In other examples such material is additionally provided between the coolant feeding channel and the coolant removing channel. In yet other embodiments, also the cavity may be formed in a material having a low thermal conductivity. Examples of materials that can be used are plastics, low-temperature, co-fired ceramics, glass-reinforced epoxy laminate sheets. Typically the manufacturing technique comprises making a cooling system as described in the first aspect and attaching it to the device chip using a fixing means, or creating a cooling system as described in the first aspect directly on the device chip. Depending on the above, the fabrication technique that can be used may be any of molding, such as for example injection molding, micromachining, drilling, CNC milling, 3D printing, welding of thermoplastic materials, gluing, etc.

As indicated above, the liquid cooling system may be first manufactured and then attached to the chip or chip package. The fixing means used for fixing the liquid cooling system to the chip or chip package may be glue. In some embodiments, the glue also may form the sealing means, so that the cooling system is sealed to the device chip and the heat transfer region is sealed so that it forms a sealed volume together with the chip to be cooled. Alternatively, also a separate sealing may be provided.

As indicated above, in another embodiment, the liquid cooling system may be manufactured directly on the chip or chip package, e.g. through 3D printing. The fixing means then is formed by the material of the liquid cooling system itself by applying it directly to the chip or chip package.

In both cases, the connection between the cooling system and the package can be made pressure resistant and hermetically sealed.

By way of illustration, the embodiments not being limited thereto, experimental results illustrating advantages of the embodiments are described below.

Figure 4:
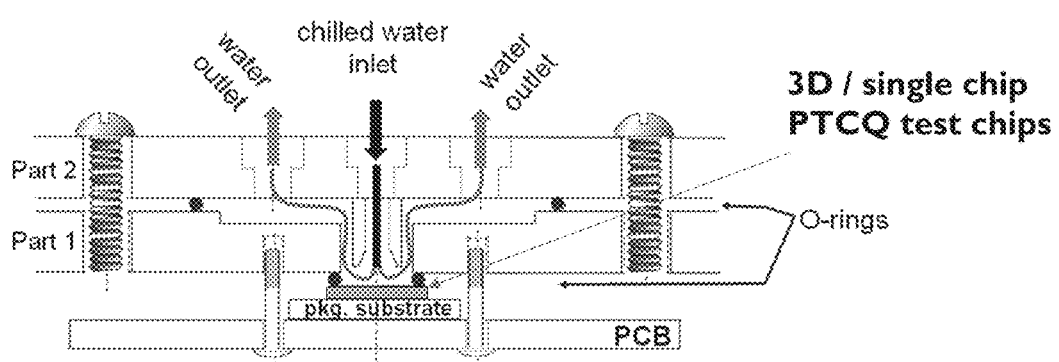
FIG. 4 illustrates an example of a single inlet jet cooling system, as can be used in the embodiments.

The results are based on a single jet demonstrator as shown in FIG. 4. The liquid cooling device, according to an embodiment of the embodiments, was assembled in a both a single test chip package and a 3D test chip package having a programmable power dissipation and allowing a full chip temperature measurement. An analysis of the lateral and vertical heat transfer in the 3D package could be made. The single jet demonstrator was based on a single jet inlet and 6 outlets. The liquid cooling device of the present example was fabricated in insulating plexi-glass.

As a reference measurement, the thermal resistance was recorded for a uniform power dissipation in the chip, without liquid cooling applied. Since the liquid cooling device is fabricated from thermally insulating material, there is a high thermal resistance and the heat is removed through the package substrate and the PCB. The measured thermal resistance varied, depending on the chip position, between 16 and 18 K/W.

Figure 5:
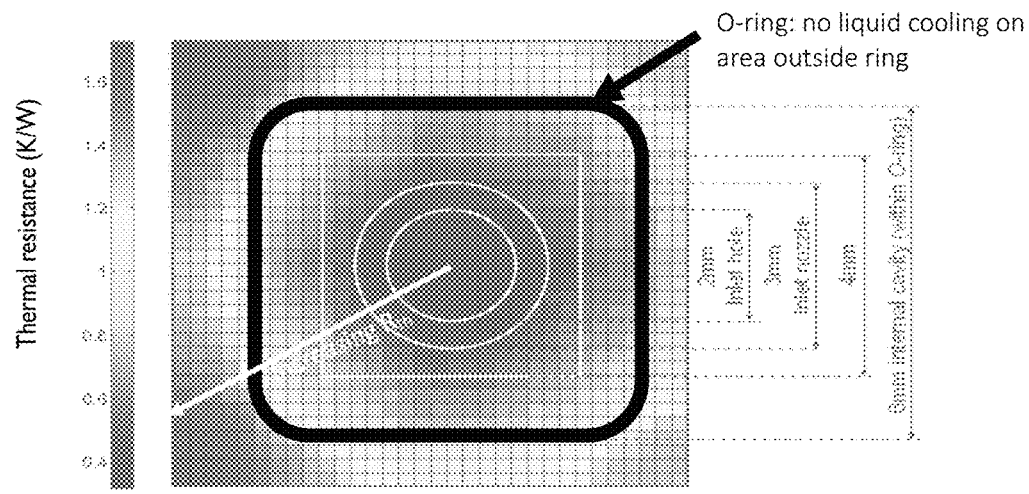
FIG. 5 illustrates an overview of the thermal resistance as function of position on the device, illustrating features and advantages of embodiments according to the embodiments.

To characterize the properties of the liquid cooling device, the thermal resistance was also measured when liquid cooling was applied using a liquid having an inlet temperature of 10° C. and with a flow rate of 0.53 l/min. The heating in the package test chip was a uniform heating with overall power of 24 W (37.5 W/cm$^2$). The resulting thermal resistance profile is shown in FIG. 5. The thermal resistance is increasing from about 0.3 K/W in the center to about 0.9 at the position where the sealing O-ring was positioned, and further to above 1.5 K/W in the corners of the chip. The thermal resistance thus is increasing from the center point where the inlet jet is impinging to the sides at the sealing ring, where the cooling liquid is present, and further increasing outside the sealing ring, where no cooling liquid is present.

Figure 6:
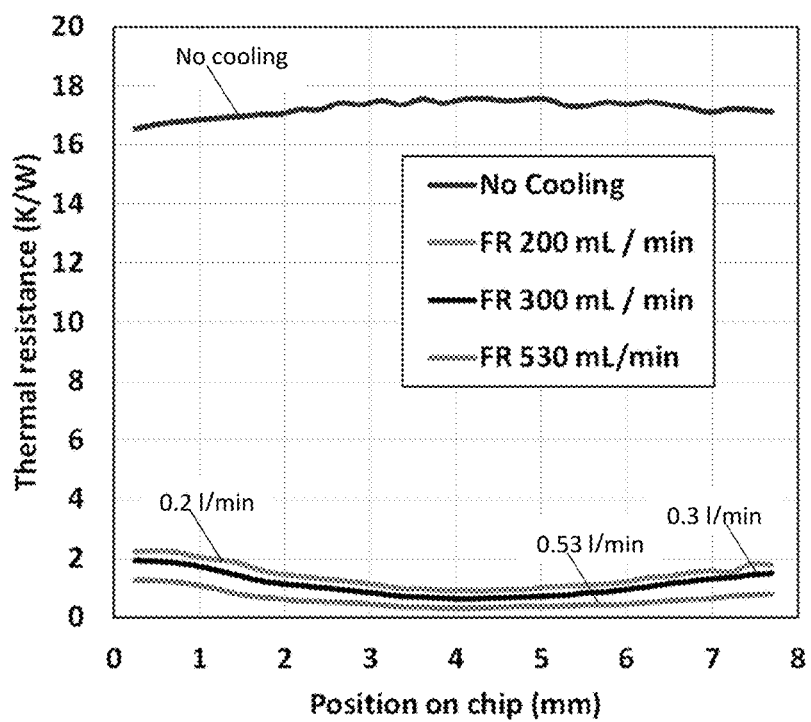
FIGS. 6 and 7 illustrate the thermal resistance in case of no cooling (FIG. 6) and as function of different cooling flow rates (FIG. 6 and FIG. 7) using a cooling system according to the embodiments.

The effect of different flow rates on the cooling is illustrated in FIG. 6, where the thermal resistance is shown for the situation where no cooling occurs, for a flow rate of 0.2 l/min, a flow rate of 0.3 l/min and a flow rate of 0.53 l/min. It can be seen that the cooling is best in the nozzle region (the center position at 4 mm) and that higher flow rates, result in a better cooling.

Figure 7:
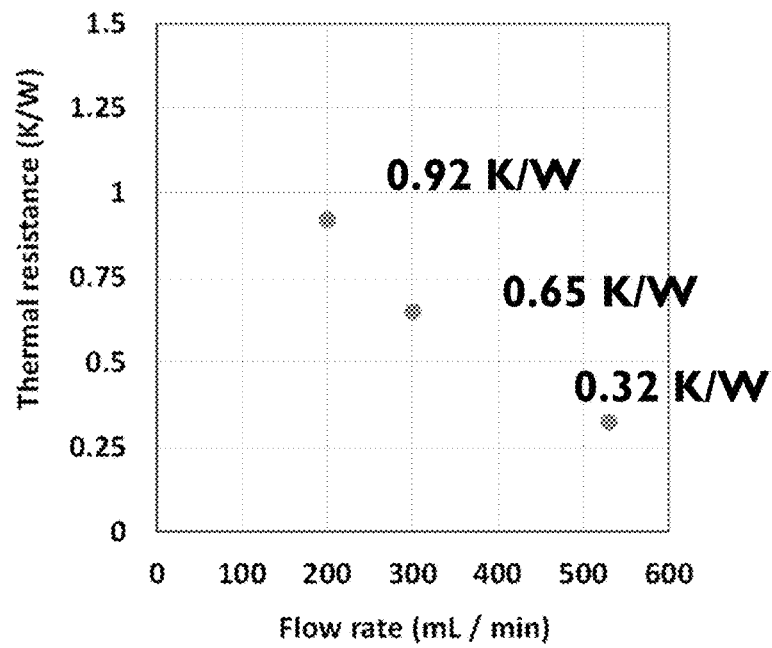

FIG. 7 illustrates the thermal resistance as function of the flow rate. It can be seen that the thermal resistance improves by a factor 3 when the flow is increased from 0.2 l/min to 0.53 l/min.

Figure 8:
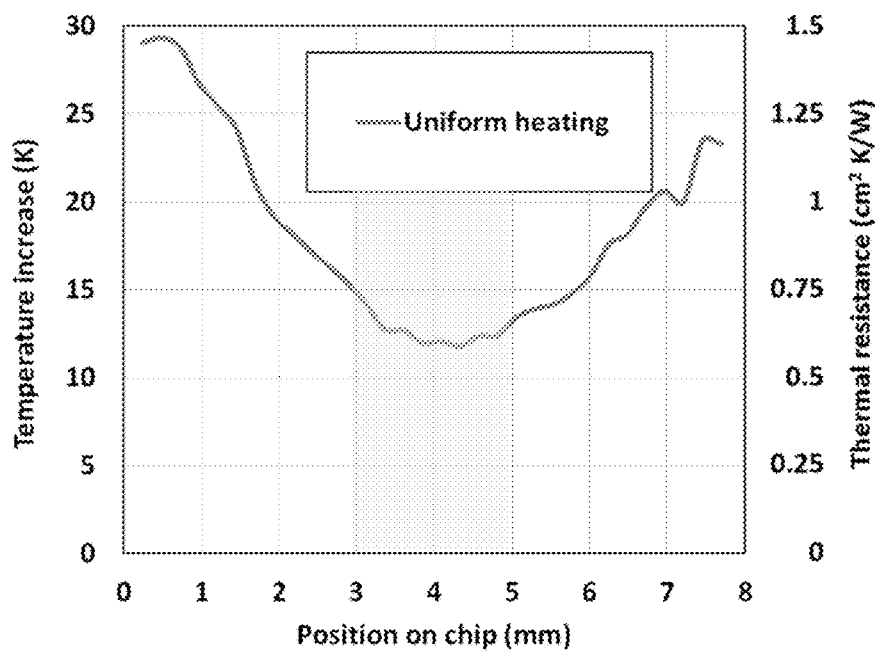
FIG. 8 and FIG. 9 illustrate the thermal resistance and temperature as function of the position on the chip for a cooling system according to FIG. 4 respectively the thermal behavior of the device, illustrating features and advantages of embodiments according to the embodiments.
Figure 9:
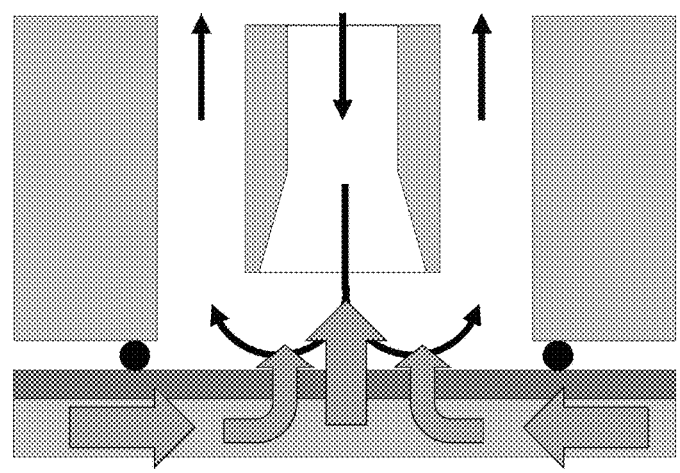

In FIGS. 8 and 9, an analysis is made of the heat dissipation for a flow rate of 0.2 l/min. The analysis was performed for a conservative chip power of 20 W/cm². It can be seen that the chip heat transferred to the liquid jet in the center of the chip. It was seen that heat from outer chip parts transferred to the liquid in the central part as well. In FIG. 8 the temperature increase for a uniform heating is shown. In FIG. 9 the heat transfer (thick arrows) and the flow direction (thin arrows) are indicated.

Figure 10:
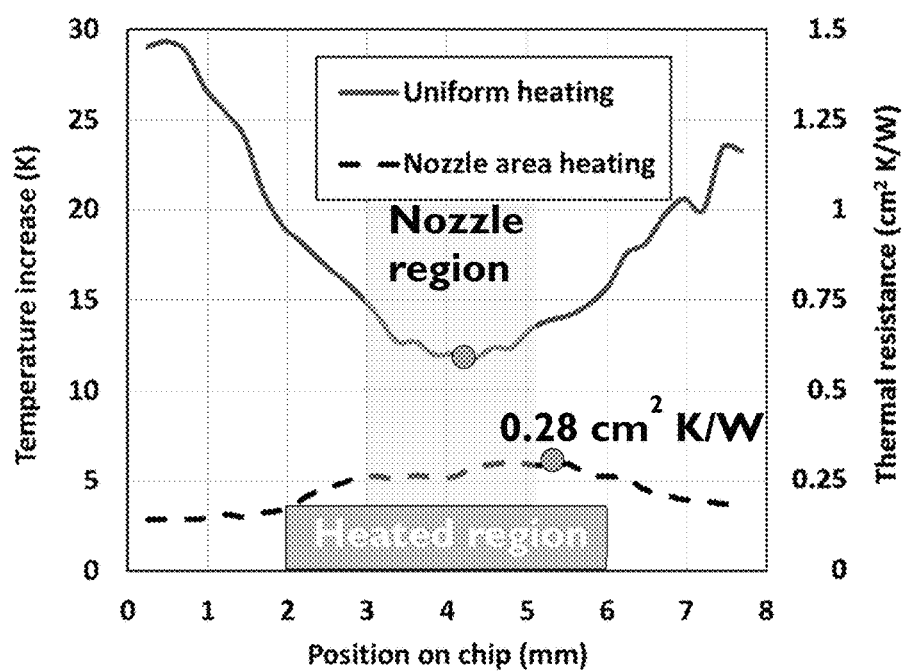
FIGS. 10 and 11 illustrate the thermal resistance and temperature as function of the position on the chip for a cooling system according to FIG. 4 used as a unit cell in a larger scaled cooling system respectively the thermal behavior of such device, illustrating features and advantages of embodiments according to the embodiments.
Figure 11:
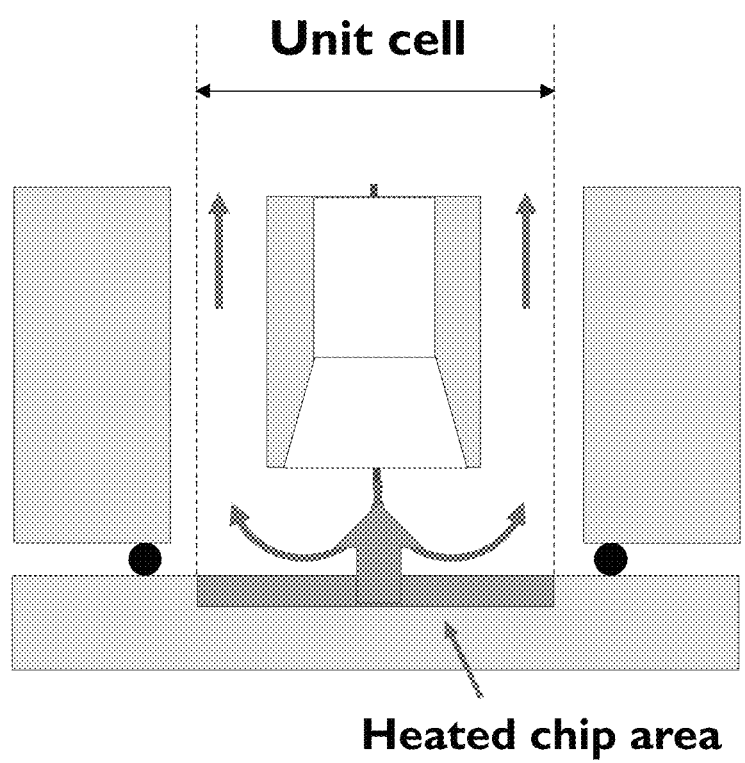

In FIG. 10 and FIG. 11, an analysis is shown for the heat dissipation for a flow rate of 0.2 l/min, but wherein the heated region is limited to the directly cooled area, so as to evaluate the cooling of a unit cell in a scalable system, i.e. in a system where additional cooling cells are present. FIG. 10 illustrates the temperature behavior for the situation wherein the size of the heated area is twice the size of the nozzle area. By way of illustration, the situation of uniform heating as illustrated in FIG. 4 also is indicated. The corresponding heat dissipation analysis is shown in FIG. 9, whereby the heat dissipation comes directly from beneath the unit cell.

Using the initial results as obtained above, for which further optimization still is possible, the cooling power that could be obtained, for example for a 10×10 mm² chip could be derived as follows:

Above it was found that for a flow rate of 0.2 l/min, a thermal resistance of 0.28 cm² K/W could be obtained. Extrapolating this result to a flowrate of 530 ml/min, which should be easily obtainable, the thermal resistance can be 0.094 cm² K/W. Taking into account that the maximum power P for which cooling can be obtained is defined as $$P = \frac{\text{allowed temperature difference}}{R_{th} \times \text{chip area}}$$

The maximum power that can be cooled is given in the below table:

| | | Flow rate | |
|---|---|---|---|
| | | 0.2 l/min | 0.53 l/min |
| Allowed Temp increase | 30° C. | 107 W | 320 W |
| | 50° C. | 175 W | 530 W |

From the above results it can be seen that an efficient cooling can be obtained using the scalable liquid cooling device according to the embodiments. It was also shown that using liquid jet impingement cooling allows avoidance of thermal interface material thermal resistance.

What is claimed is:

1. An electronic device comprising:
   a chip;
   a chip package comprising a chip package substrate, wherein the chip is mounted on the chip package substrate;
   a liquid cooling system comprising:
      an inlet plenum comprising a coolant feeding channel oriented substantially parallel with a plane of a main surface to be cooled of the chip and a plurality of inlet cooling channels fluidically connected to the coolant feeding channel and arranged vertically, wherein the plurality of inlet cooling channels are configured for impinging a liquid coolant directly on the main surface of the chip when the liquid cooling system is mounted to the chip and is in operation;
      an outlet plenum comprising a coolant removal channel and a plurality of outlet cooling channels arranged vertically, wherein the plurality of outlet cooling channels are configured for guiding the liquid coolant, after the impinging of the liquid coolant on the main surface to be cooled of the chip, towards the coolant removing channel for removal of the liquid coolant from the liquid cooling system, when the liquid cooling system is mounted to the chip and is in operation;
      wherein each inlet cooling channel of the plurality of inlet cooling channels is substantially parallel to each outlet cooling channel of the plurality of outlet cooling channels and wherein each inlet cooling channel is separated from an adjacent outlet cooling channel by a thermally isolating material; and
      wherein the liquid cooling system further comprises at least one cavity wherein the plurality of inlet cooling channels and the plurality of outlet cooling channels end, wherein the at least one cavity is configured for allowing interaction between the liquid coolant provided through the plurality of inlet cooling channels and the main surface of the chip, when the liquid cooling system is mounted to the chip, and wherein, in operation, the cavity is configured as a heat transfer region, wherein the liquid cooling system is directly formed on the chip of the electronic device;
   a pump adapted for pumping the liquid coolant through the liquid cooling system; and
   a hermetic seal configured to seal the liquid cooling system to the main surface of the chip, which is a back side of the chip, wherein the hermetic seal is situated along an edge of the chip so as to maximize an area of the chip to be cooled, and such that the back side of the chip is exposed to the liquid coolant and such that the coolant does not make contact with a front side of the chip or with electrical circuitry of the chip package substrate.

2. The electronic device of claim 1, wherein a distribution of each inlet cooling channel within the plurality of inlet cooling channels is not spatially uniform.

3. The electronic device of claim 1, wherein a cross-section of one of the inlet cooling channels of the plurality of inlet cooling channels is substantially smaller than an average cross-section of the outlet cooling channels within the plurality of outlet cooling channels.

4. The electronic device of claim 1, wherein the liquid cooling system comprises a plurality of unit cells, wherein each unit cell comprises an inlet cooling channel of the plurality of inlet cooling channels and four adjacent outlet cooling channels of the plurality of outlet cooling channels, and wherein the unit cells are arranged such that the outlet cooling channels are used in common by different unit cells.

5. The electronic device of claim 1, wherein each inlet cooling channel of the plurality of inlet cooling channels comprises an orifice, wherein the plurality of inlet cooling channels are configured for forming a showerhead for the impinging a plurality of liquid coolant jets onto the main surface to be cooled of the chip.

6. The electronic device of claim 1, wherein the hermetic seal comprises a glue.

7. A method for cooling the electronic device of claim 1, the method comprising:

pumping the liquid coolant through the inlet plenum towards the main surface to be cooled of the chip such that the liquid coolant impinges via the plurality of inlet cooling channels directly on the main surface to be cooled of the chip; and thereafter collecting the liquid coolant for removal from the liquid cooling system through the outlet plenum, whereby the electronic device of claim 1 is cooled.

8. A method of manufacturing the electronic device of claim 1, the method comprising:

obtaining the chip package comprising the chip package substrate upon which the chip is mounted, providing the liquid cooling system and affixing it to the chip, such that direct impingement of the liquid coolant on the main surface to be cooled of the chip occurs during operation, wherein the liquid cooling system is directly formed on the chip, whereby the electronic device of claim 1 is obtained.

9. The method of claim 8, wherein the providing the liquid cooling system comprises gluing the liquid cooling system to the chip.

10. The electronic device of claim 1, wherein the liquid cooling system is manufactured directly on the chip through 3D printing.

11. The electronic device of claim 1, wherein the hermetic seal is a thermally curable adhesive.

12. The electronic device of claim 1, wherein the hermetic seal is a UV curable adhesive at room temperature.

* * * * *